United States Patent
Lee

(10) Patent No.: US 9,627,457 B2
(45) Date of Patent: Apr. 18, 2017

(54) ORGANIC LIGHT EMITTING DISPLAY DEVICE AND METHOD OF MANUFACTURING THE SAME

(71) Applicant: Samsung Display Co., Ltd., Gyeonggi-do (KR)

(72) Inventor: Sang Bong Lee, Yongin (KR)

(73) Assignee: SAMSUNG DISPLAY CO., LTD., Yongin, Gyeonngi-Do (KR)

(*) Notice: Subject to any disclaimer, the term of this patent is extended or adjusted under 35 U.S.C. 154(b) by 39 days.

(21) Appl. No.: 14/243,363

(22) Filed: Apr. 2, 2014

(65) Prior Publication Data
US 2015/0008820 A1   Jan. 8, 2015

(30) Foreign Application Priority Data
Jul. 5, 2013  (KR) .................. 10-2013-0078984

(51) Int. Cl.
*H01L 51/52*  (2006.01)
*H01L 27/32*  (2006.01)

(52) U.S. Cl.
CPC ...... *H01L 27/3246* (2013.01); *H01L 27/3218* (2013.01); *H01L 2251/558* (2013.01)

(58) Field of Classification Search
CPC ..... H05B 33/10; H05B 33/12; H01L 27/3246; H01L 27/3218; H01L 2251/558
See application file for complete search history.

(56) References Cited

U.S. PATENT DOCUMENTS

| | | | |
|---|---|---|---|
| 6,747,618 B2* | 6/2004 | Arnold et al. ................... 345/77 |
| 7,198,879 B1* | 4/2007 | Tredwell et al. ............. 430/200 |
| 7,825,584 B2* | 11/2010 | Kim ............................... 313/504 |
| 8,330,352 B2* | 12/2012 | Sung et al. .................... 313/504 |
| 8,841,833 B2* | 9/2014 | Higo et al. ..................... 313/504 |
| 2001/0001050 A1* | 5/2001 | Miyashita et al. ............ 428/690 |
| 2003/0052597 A1* | 3/2003 | Sakurai .......................... 313/504 |
| 2003/0162108 A1* | 8/2003 | Burberry et al. ............... 430/20 |
| 2004/0036421 A1* | 2/2004 | Arnold et al. ............. 315/169.3 |
| 2004/0108818 A1* | 6/2004 | Cok et al. .................. 315/169.3 |
| 2004/0125278 A1* | 7/2004 | Park et al. ..................... 349/106 |
| 2004/0201558 A1* | 10/2004 | Arnold et al. ................... 345/83 |
| 2004/0217694 A1* | 11/2004 | Cok et al. ...................... 313/504 |
| 2005/0001542 A1* | 1/2005 | Kiguchi ......................... 313/504 |
| 2005/0087740 A1* | 4/2005 | Matsumoto et al. ........... 257/72 |

(Continued)

FOREIGN PATENT DOCUMENTS

JP     2003-229258      8/2003
KR   10-2005-0068860 A   7/2005
(Continued)

*Primary Examiner* — Donald Raleigh
(74) *Attorney, Agent, or Firm* — Lee & Morse P.C.

(57) ABSTRACT

An organic light emitting display device includes a spacer on a pixel defining layer. The pixel defining layer includes openings corresponding to pixels. The device further includes first pixels to third pixels emitting light having different colors. The first pixels and the second pixels are alternately disposed in a row direction, and the third pixels are continuously disposed in a row direction. The row in which the first pixels and the second pixels are alternately disposed and the row in which the third pixels are continuously disposed are adjacent to each other in a column direction The spacer is disposed between two of the third pixels.

21 Claims, 14 Drawing Sheets

(56) References Cited

U.S. PATENT DOCUMENTS

| | | | |
|---|---|---|---|
| 2005/0151462 A1* | 7/2005 | Miyagawa | 313/500 |
| 2006/0105201 A1* | 5/2006 | Lee et al. | 428/690 |
| 2006/0170712 A1* | 8/2006 | Miller et al. | 345/695 |
| 2007/0001584 A1* | 1/2007 | Lee et al. | 313/500 |
| 2007/0046185 A1* | 3/2007 | Kim | 313/504 |
| 2008/0111459 A1* | 5/2008 | Helber et al. | 313/112 |
| 2008/0158107 A1* | 7/2008 | Miller et al. | 345/76 |
| 2009/0295283 A1* | 12/2009 | Kim et al. | 313/504 |
| 2010/0207878 A1* | 8/2010 | Nishikawa | H01L 51/5265 345/156 |
| 2011/0084287 A1* | 4/2011 | Lee | H01L 51/5237 257/88 |
| 2011/0193476 A1* | 8/2011 | Higo et al. | 313/504 |
| 2012/0313844 A1* | 12/2012 | Im | H01L 27/3216 345/76 |

FOREIGN PATENT DOCUMENTS

| | | |
|---|---|---|
| KR | 10-2006-0066512 A | 6/2006 |
| KR | 10-2011-0085471 A | 7/2011 |

* cited by examiner

ORGANIC LIGHT EMITTING DISPLAY DEVICE AND METHOD OF MANUFACTURING THE SAME

CROSS-REFERENCE TO RELATED APPLICATION

Korean Patent Application No. 10-2013-0078984, filed on Jul. 5, 2013, and entitled, "Organic Light Emitting Display Device and Method of Manufacturing the Same," is incorporated by reference herein in its entirety.

BACKGROUND

1. Field

One or more embodiments described herein relate to a display device.

2. Description of the Related Art

Various types of flat panel displays have been developed. Examples include a liquid crystal display, an organic light emitting display device, and an electrophoretic display device. In an organic light emitting display device, each pixel emit lights from an organic light emitting diode in response to signals applied to its anode and the cathode. Each diode includes an organic emission layer, which emits light at a brightness that correspond to a current flowing in the organic emission layer.

SUMMARY

In accordance with one embodiment, an organic light emitting display device includes a substrate; a pixel defining layer on the substrate, the pixel defining layer including a plurality of openings corresponding to a plurality of pixels; and a spacer on the pixel defining layer, wherein the plurality of pixels includes a plurality of first pixels, a plurality of second pixels, and a plurality of third pixels emitting light of different colors, wherein the first pixels and the second pixels are alternately disposed in a row direction and the third pixels are continuously disposed in a row direction, and wherein the row in which the first pixels and the second pixels are alternately disposed and the row in which the third pixels are continuously disposed are adjacent to each other in a column direction, and the spacer is disposed between two of the third pixels.

Also, the row in which the first pixels and the second pixels are alternately disposed, and the row in which the third pixels are continuously disposed, are alternately disposed.

Also, the device further includes a plurality of anodes including first to third anodes on the substrate; an organic emission layer on the plurality of anodes; and a cathode on the organic emission layer, wherein: the first anode is in the first pixel, the second anode is in the second pixel, the third anode is in the third pixel, and a partial region of the plurality of anodes is below the pixel defining layer, and wherein the spacer overlaps the third anode.

Also, the organic emission layer includes: a first organic emission layer in the first pixel and emitting light of a first color; a second organic emission layer in the second pixel and emitting light of a second color; and a third organic emission layer in the first to third pixels and emitting light of a third color.

The third organic emission layer may be on the first organic emission layer and the second organic emission layer. Additionally, or alternatively, the third organic emission layer may be below the first organic emission layer and the second organic emission layer.

Also, a height of the pixel defining layer may be substantially 2,000 to 5,000 Å, and a height of the spacer is substantially 3,000 to 7,000 Å. A distance between the spacer and the first pixel and a distance between the spacer and the second pixel may be 8 μm or more. A distance between the spacer and the third pixel may be 3 μm or less. The pixel defining layer and the spacer may be separately or integrally formed.

In accordance with another embodiment, a method of manufacturing an organic light emitting display device includes preparing a substrate; forming a plurality of anodes including a plurality of first anodes, a plurality of second anodes, and a plurality of third anodes on the substrate; forming a pixel defining layer on the plurality of anodes and the substrate, the pixel defining layer including a plurality of openings exposing respective areas of the plurality of anodes; forming a spacer on the pixel defining layer; forming a first organic emission layer on the first anode and forming a second organic emission layer on the second anode; forming a third organic emission layer on the first organic emission layer and the second organic emission layer; and forming a cathode on the third organic emission layer. The first anodes and the second anodes are alternately disposed in a row direction and the third anodes are continuously disposed in the row direction. The row in which the first pixels and the second pixels are alternately disposed and the row in which the third pixels are continuously disposed are adjacent to each other in a column direction. The spacer is disposed between the openings exposing two adjacent third anodes in the row direction.

Also, the first organic emission layer and the second organic emission layer are formed by laser transfer. The spacer may be formed on the pixel defining layer by deposition. The spacer is formed by selectively removing the pixel defining layer. The spacer may be formed to overlap the third anode.

Also, a height of the pixel defining layer may be substantially 2,000 to 5,000 Å. A height of the spacer may be substantially 3,000 to 7,000 Å. A distance between the spacer and the first pixel and a distance between the spacer and the second pixel may be 8 μm or more. A distance between the spacer and the third pixel is 3 μm or less.

In accordance with another embodiment, a method of manufacturing an organic light emitting display device includes preparing a substrate including a base, a plurality of thin film transistors disposed on the base, and an insulating layer on the thin film transistors and having a plurality of via holes exposing respective areas of the plurality of thin film transistors; forming a plurality of anodes on the substrate, the plurality of anodes connected to the plurality of thin film transistors through the plurality of via holes, the plurality of anodes including a plurality of first anodes, a plurality of second anodes, and a plurality of third anodes; forming a pixel defining layer on the plurality of anodes, the pixel defining layer including with a plurality of openings exposing respective areas of the plurality of anodes; forming a spacer on the pixel defining layer; forming a third organic emission layer on the first to third anodes; forming a first organic emission layer on the first anode and the third organic emission layer and forming a second organic emission layer on the second anode and the third organic emission layer; and forming a cathode on the first to third organic emission layers.

The first anodes and the second anodes are alternately disposed in a row direction and the third anodes are continuously disposed in the row direction. The row in which the first pixels and the second pixels are alternately disposed and the row in which the third pixels are continuously disposed are adjacent to each other in a column direction. The spacer is disposed between the openings exposing two adjacent third anodes in the row direction.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
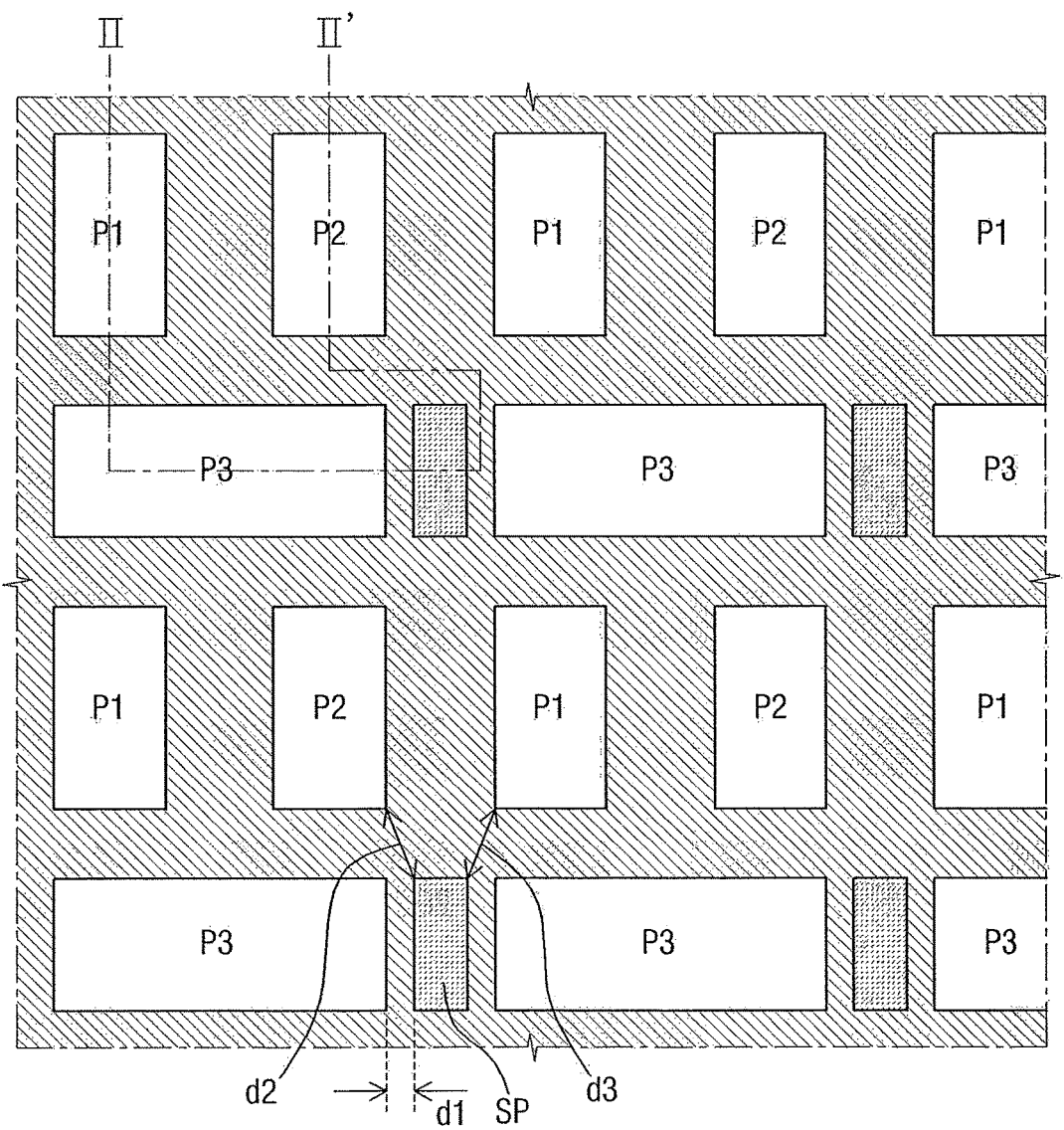
FIG. 1 illustrates an embodiment of an organic light emitting display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
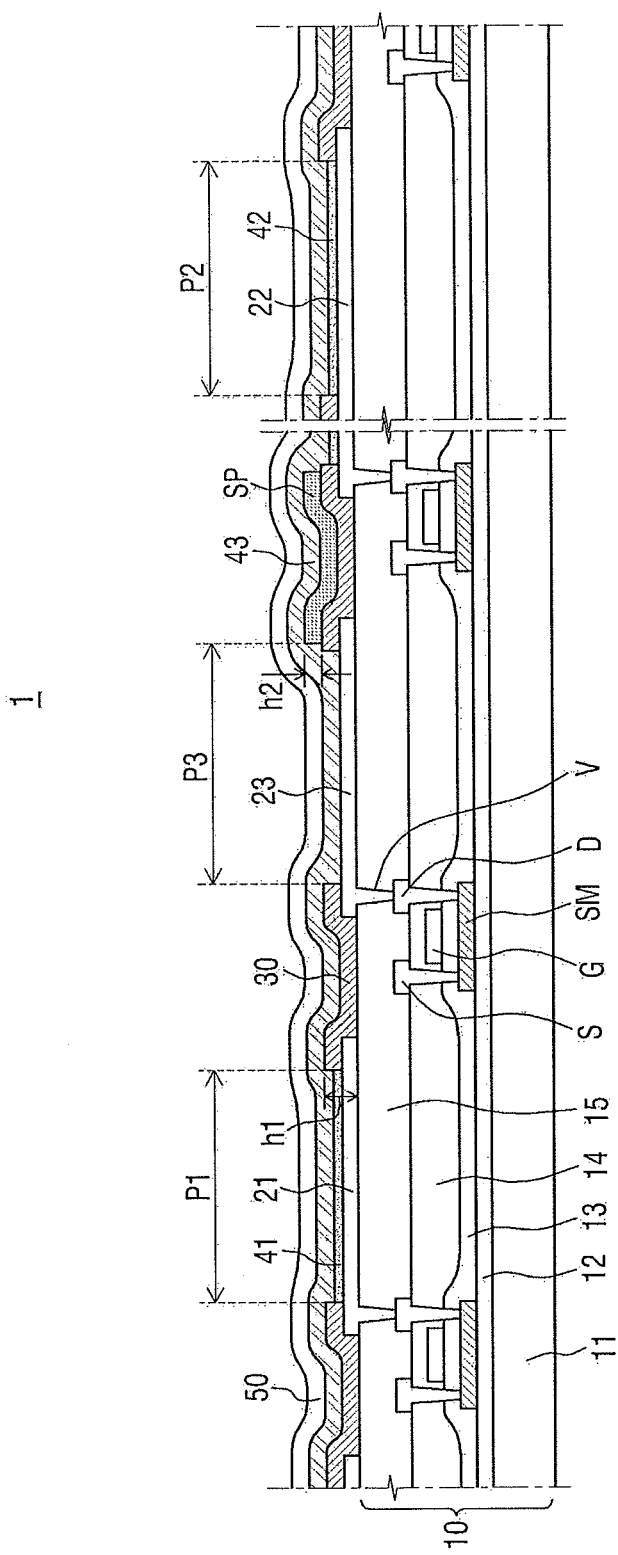
FIG. 2 illustrates a view along section line II-II' in FIG. 1.

FIG. 1 illustrates a plan view of an embodiment of an organic light emitting display device. FIG. 2 illustrates a cross-sectional view of the organic light emitting display device taken along line II to II' of FIG. 1.

Referring to FIGS. 1 to 2, an organic light emitting display device 1 includes a substrate 10, a pixel defining layer 30, and a spacer SP. The substrate 10 may include a base 11, a buffer layer 12, a gate insulating layer 13, an interlayer insulating layer 14, a plurality of thin film transistors, each including a semiconductor layer SM, a gate electrode G, a source electrode S, and a drain electrode D, and a planarization layer 15.

The base 11 may be made of an insulating material such as glass, quartz, ceramic, plastic, or the like. In one embodiment, the base 11 may have a flat plate shape. Also, according to some embodiments, the base 11 may be made of a material which is easily flexible by external force. The base 11 may support other constituent elements disposed on the base 11.

The buffer layer 12 may be disposed on the base 11. The buffer layer 12 prevents impure elements from penetrated into and for planarizing an upper surface of the base 11. The buffer layer 12 may be made of various materials capable of performing such a function. For example, one of a silicon nitride ($SiN_x$) layer, a silicon oxide ($SiO_2$) layer, or a silicon oxynitride ($SiO_xN_y$) layer may be used as the buffer layer 12. According to some embodiments, the buffer layer 12 may be omitted.

The semiconductor layer SM may be disposed on the buffer layer 11. The semiconductor layer SM may be formed as an amorphous silicon layer or a polycrystal silicon layer. According to some embodiments, the semiconductor layer SM may be made of an organic semiconductor material. The semiconductor layer SM may include a channel region in which impurities are not doped. A source region and a drain region are disposed at respective sides of the channel region and are in contact with the source electrode S and the drain electrode D, respectively.

The gate insulating layer 13 may be disposed on the semiconductor layer SM. The gate insulating layer 13 may insulate the gate electrode G and the semiconductor layer SM from each other. The gate insulating layer 13 may be formed of silicon nitride ($SiN_x$) or silicon oxide ($SiO_2$), for example.

The gate electrode G may be disposed on the gate insulating layer 13. The gate electrode G may be disposed to overlap at least a partial region of the semiconductor layer SM. The semiconductor layer SM may or may not be in a conductive state depending on whether a voltage is applied to the gate electrode G. For example, when a relatively high voltage is applied to the gate electrode G, the semiconductor layer SM is in a conductive state, and thus the drain electrode D and the source electrode S may be electrically connected to each other. When a relatively low voltage is applied to the gate electrode G, the semiconductor layer SM is in a non-conductive state, and thus the drain electrode D and the source electrode S may be insulated from each other.

The interlayer insulating layer 14 may be disposed on the gate electrode G. The interlayer insulating layer 14 may cover the gate electrode G to insulate the gate electrode G from the source electrode S and the drain electrode D. The interlayer insulating layer 14 may be made of silicon nitride ($SiN_x$), silicon oxide ($SiO_2$), or the like.

The source electrode S and the drain electrode D may be disposed on the interlayer insulating layer 14. The source electrode S and the drain electrode D may be connected with the semiconductor layer SM though a through-hole passing through the interlayer insulating layer 14 and the gate insulating layer 13, respectively.

The source electrode S, the drain electrode D, the gate electrode G, and the semiconductor layer SM may form a thin film transistor. The thin film transistor may determine whether to transfer a signal transferred to the source electrode S to the drain electrode D, according to a voltage applied to the gate electrode G.

A planarization layer 15 may be disposed on the interlayer insulating layer 14, the source electrode S, and the drain electrode D. The planarization layer 15 removes a step on the source electrode S and the drain electrode D to form a planarized surface, in order to improve emission efficiency of organic emission layers 41, 42, and 43 disposed on the planarization layer 15, to be described in greater detail below.

The planarization layer 15 may be made of one or more materials of polyacrylates resin, epoxy resin, phenolic resin, polyamides resin, polyimide resin, unsaturated polyester resin, poly phenylenethers resin, poly phenylenesulfides resin, and benzocyclobutene (BCB). A via hole V may be formed in the planarization layer 15, and anodes 21, 22, and 23 to be described below contact the drain electrode D through the via hole V to be electrically connected with each other.

The pixel defining layer 30 may be disposed on the substrate 10. A plurality of openings may be formed in the pixel defining layer 30, and a plurality of pixels P1, P2, and P3 may be defined by respective inner regions of the plurality of openings. In order to decrease a thickness of the organic light emitting display device 1, a height h1 of the pixel defining layer 30 needs to be decreased. However, when the height h1 of the pixel defining layer 30 is excessively small, the organic emission layer disposed in one pixel penetrates into other adjacent pixels, to decrease display quality of the organic light emitting display device 1. As a result, the height h1 of the pixel defining layer 30 may have a minimum limit. For example, the height h1 of the pixel defining layer 30 may be substantially 2,000 to 5,000 Å.

The plurality of pixels P1, P2, and P3 may include a first pixel P1, a second pixel P2, and a third pixel P3. The first to third pixels P1, P2, and P3 may be pixels having different colors. For example, the first pixel P1 may be a red pixel, the second pixel P2 may be a green pixel, and the third pixel P3 may be a blue pixel. The first pixels P1 and the second pixels P2 may be alternately disposed in a row direction. The third pixels P3 may be continuously disposed in a row direction. The row in which the first pixels P1 and the second pixels P2 are alternately disposed, and the row in which the third pixels P3 are continuously disposed, may be adjacent to each other in a column direction. The row in which the first pixels P1 and the second pixels P2 are alternately disposed, and the row in which the third pixels P3 are continuously disposed, may be alternately disposed in a column direction.

The spacer SP may be made of substantially the same material as the pixel defining layer 30, or a different material. The spacer SP may be disposed on the pixel defining layer 30. The spacer SP may be disposed between two adjacent third pixels P3. When a first organic layer 41 or a second organic layer 42 is formed by laser transfer, a region where the spacer SP is disposed further protrudes upward as compared with a region where the spacer SP is not disposed. Accordingly, a distance from the adjacent third pixels PX and a donor film in the spacer SP is larger than a distance between the first pixel P1 and the second pixel P2 and the donor film.

As a result, when the first organic layer 41 is formed in the first pixel P1, or the second organic layer 42 is formed in the second pixel P2, the possibility of the first organic layer 41 or the second organic layer 42 penetrating into the third pixel P3 may be reduced as a result of the spacer SP. The spacer SP also allows for a distance between the third pixel P3 and the first pixel P1 and a distance between the third pixel P3 and the second pixel P2 to be reduced. This may translate into an improvement or increase in the aperture ratio and the resolution of the organic light emitting display device 1. This will be described below in more detail with reference to FIG. 8.

When the height of the spacer SP is excessively large, the distance between the donor film and the first pixel P1 and the second pixel P2 is excessively large. Thus, the first organic layer 41 may not be smoothly transferred into the first pixel P1, or the second organic layer 42 may not be smoothly transferred into the second pixel P2. Conversely, when the height of the spacer SP is excessively small, the first organic layer 41 or the second organic layer 42 may penetrate into the third pixel P3. In order for the first organic layer 41 and/or the second organic layer 42 to smoothly transfer to the first pixel P1 and/or the second pixel P2, and to prevent the first organic layer 41 and/or the second organic layer 42 from penetrating into the third pixel P3, a height h2 of the spacer SP measured from the upper portion of the pixel defining layer 30 may be substantially 3,000 to 7,000 Å.

When a distance d1 between the spacer SP and the third pixel P3 is excessively large, the spacer SP may not effectively perform the function of preventing the first organic layer 41 and/or the second organic layer 42 from penetrating into the third pixel P3. In order to prevent the first organic layer 41 and/or the second organic layer 42 from penetrating into the third pixel P3, the distance d1 between the spacer SP and the third pixel P3 may be about 3 μm or less.

When a distance d2 between the spacer SP and the first pixel P1 is excessively small, the first organic layer 41 may not be properly transferred to the region of the first pixel P1 adjacent to the spacer SP. Accordingly, in order for the first organic layer 41 to transfer into the first pixel P1, the distance d2 between the spacer SP and the first pixel P1 may be about 8 μm or more. Similarly, a distance d3 between the spacer SP and the second pixel P2 may be about 8 μm or more.

The spacer SP may overlap a third anode 23. That is, at least a partial region of the spacer SP may be disposed on the third anode 23. When the thickness of the pixel defining layer 30 is small, a shape of the upper surface of the pixel defining layer 30 may be curved according to, for example, a shape of a lower portion of the pixel defining layer 30. The region of the upper surface of the pixel defining layer 30, which overlaps the third anode 23, may be disposed at the highest portion of the upper surface of the pixel defining layer 30. Therefore, when the spacer SP overlaps the third anode 23, the spacer SP may be formed to have a sufficient height even though a small amount of material is used in the formation of the spacer SP.

The organic light emitting display device 1 may further include a plurality of anodes 21, 22, and 23, organic emission layers 41, 42, and 43, and a cathode 50.

The plurality of anodes 21, 22, and 23 may be disposed on the substrate. The plurality of anodes 21, 22, and 23 may be made of a reflective conductive material, a transparent conductive material, or a semi-transparent conductive material. For example, the reflective conductive material may use lithium (Li), calcium (Ca), lithium fluoride/calcium (LiF/Ca), lithium fluoride/aluminum (LiF/Al), aluminum (Al), silver (Ag), magnesium (Mg), or gold (Au), the transparent conductive material may use indium tin oxide (ITO), indium zinc oxide (IZO), zinc oxide (ZnO), or indium oxide ($In_2O_3$), and the semi-transparent conductive material may use a co-deposition material including one or more of magnesium (Mg) and silver (Ag) or one or more materials of magnesium (Mg), silver (Ag), calcium (Ca), lithium (Li), and aluminum (Al).

Each of the plurality of anodes 21, 22, and 23 may be connected with the thin film transistor through the via hole V. The plurality of anodes 21, 22, and 23 are spaced apart from each other to be disposed in one pixel of the plurality of pixels P1, P2, and P3. The plurality of anodes 21, 22, and 23 may include a first anode 21, a second anode 22, and a third anode 23. The first anode 21 may be disposed in the first pixel P1, the second anode 22 may be disposed in the second pixel P2, and the third anode 23 may be disposed in the third pixel P3. An edge region of each of the plurality of anodes 21, 22, and 23 may be disposed below the pixel defining layer 30, but is not necessarily limited thereto.

The organic emission layers 41, 42, and 43 may be disposed on the plurality of anodes 21, 22, and 23. When a current flows in the organic emission layers 41, 42, and 43, light may be emitted. More specifically, when holes and electrons are supplied to the organic layers 41, 42, and 43 and an energy level of excitons (formed by the coupling of holes and electron) changes from an excited state to a ground state, light may be emitted having a color corresponding to the changed energy level. According to some embodiments, the color of the light emitted by the organic emission layers 41, 42, and 43 may be one of red, blue, and green. Brightness of the light emitted by the organic emission layers 41, 42, and 43 may be changed in response to a magnitude of the current flowing in the organic layers.

The organic emission layers 41, 42, and 43 may include a first organic emission layer 41, a second organic emission layer 42, and a third organic emission layer 43 which emit light having different colors. Alternatively, the emission layers may emit white light through different color filters.

For example, the first organic emission layer 41 may emit red light, the second organic emission layer 42 may emit green light, and the third organic emission layer 43 may emit blue light, but they are not necessarily limited thereto. The first organic emission layer 41 is disposed on the first anode 21 to be disposed in the first pixel P1. The second organic emission layer 42 is disposed on the second anode 22 to be disposed in the second pixel P2. The third organic emission layer 43 may be disposed on the first to third anodes 21, 22, and 23, and be disposed on the first and second organic emission layers 41 and 42. The third organic emission layer 43 may be disposed on the front side of the organic light emitting display device 1. The third organic emission layer 43 disposed in the first pixel P1 or the second pixel P2 does not emit light, and thus may not influence colors of the first pixel P1 and the second pixel P2.

The cathode 50 may be disposed on the organic emission layers 41, 42, and 43. The cathode 50 may be disposed to face the plurality of anodes 21, 22, and 23. The cathode 50 may be integrally disposed on the front side of the organic light emitting display device 1, but is not necessarily limited thereto. The cathode 50 may be made of the same material as the anodes 21, 22, and 23, but is not necessarily limited thereto. For example, in the case where the anodes 21, 22, and 23 are reflective electrodes, the cathode 50 may be a transparent or semi-transparent electrode. In the case where the anodes 21, 22, and 23 are transparent or semi-transparent electrodes, the cathode 50 may be a reflective electrode.

Figure 3:
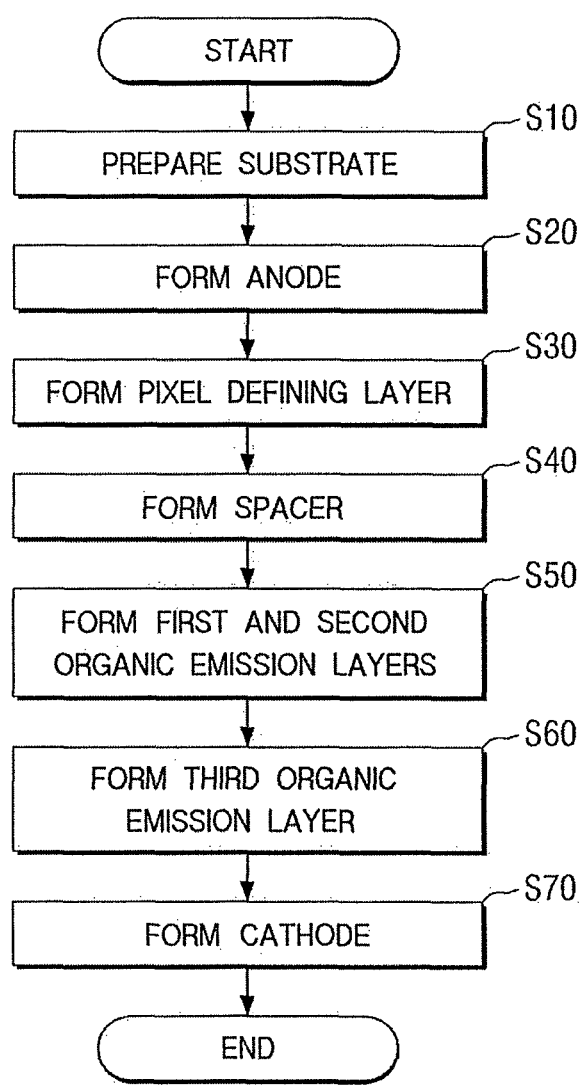
FIG. 3 illustrates an embodiment of a method of manufacturing an organic light emitting display device.

FIGS. 3 to 10 describe an embodiment of a method for manufacturing organic light emitting display device 1. Particularly, FIG. 3 illustrates a flowchart of operations included in a method of manufacturing an organic light emitting display device. FIGS. 4 to 10 illustrate cross-sectional views of the organic light emitting display device at various stages of the method. In particular, FIGS. 4 to 10 illustrate cross-sectional views of the organic light emitting display device with respect to the same region as II to II' of FIG. 1.

Referring to FIG. 3, the method may include preparing the substrate 10 (S10), forming the anodes 21, 22, and 23 (S20), forming the pixel defining layer 30 (S30), forming the spacer SP (S40), forming the first and second organic emission layers 41 and 42 (S50), forming the third organic emission layer 43 (S60), and forming the cathode 50 (S70).

Figure 4:
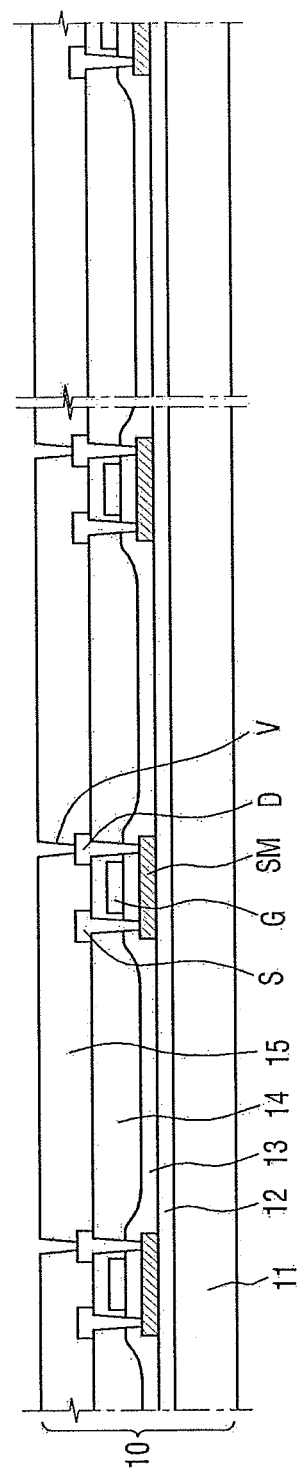
FIGS. 4 to 10 illustrate cross-sectional views corresponding to various stages of an embodiment of a method of manufacturing the organic light emitting display device.

The substrate 10 may be prepared, for example, as illustrated in FIG. 4. The substrate 10 may be substantially the same as the substrate 10 in FIG. 2.

Figure 5:
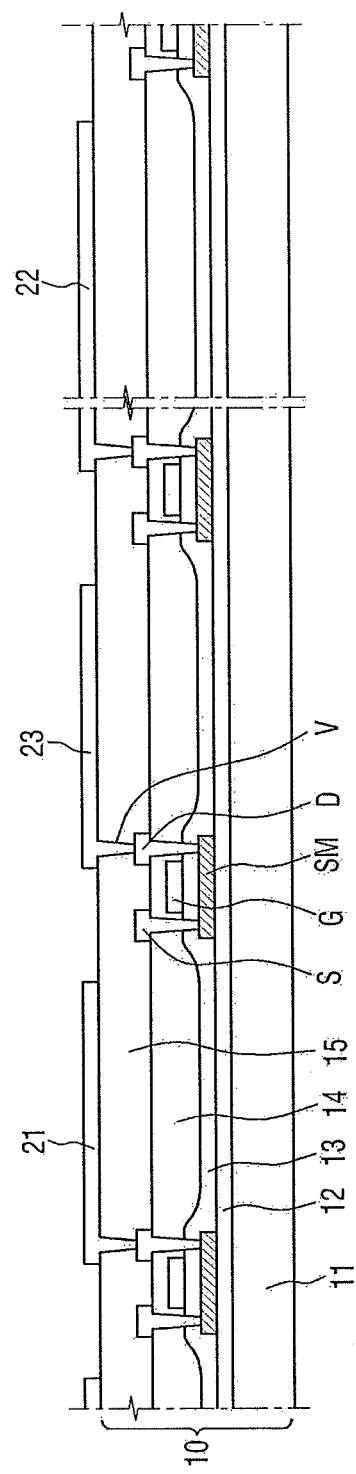

In forming the anodes 21, 22, and 23 (S20), the plurality of anodes 21, 22, and 23 may be formed on the substrate 10, as illustrated in FIG. 5. The anodes 21, 22, and 23 may be formed by deposition using a mask, but are not necessarily limited thereto. Each of the plurality of anodes 21, 22, and 23 may be connected with the thin film transistor through the via hole V.

Figure 6:
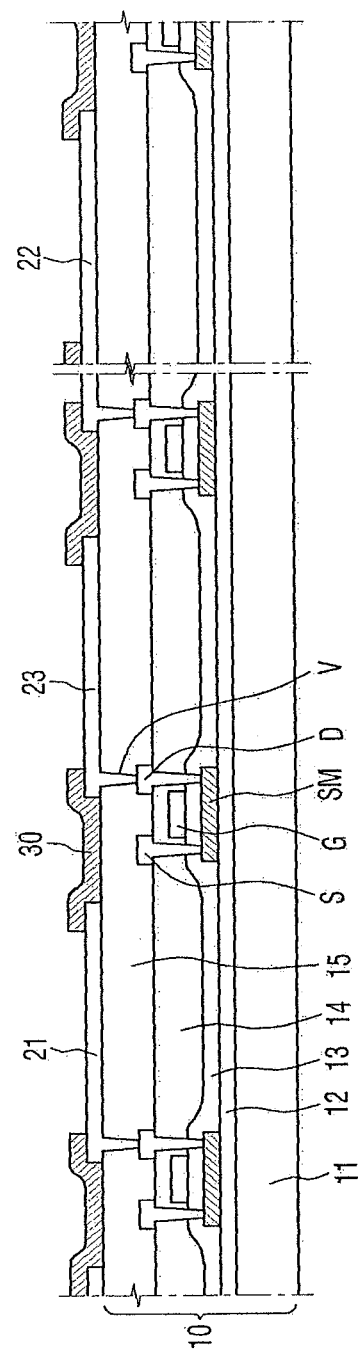

In forming the pixel defining layer 30 (S30), the pixel defining layer 30 is formed on the substrate 10, as illustrated in FIG. 6. The pixel defining layer 30 may be formed by deposition using a mask, but is not necessarily limited thereto. For example, by coating a material for forming the pixel defining layer 30 on the entire surface and then removing openings, the pixel defining layer 30 having a shape illustrated in FIG. 6 may be formed. The pixel defining layer 30 may be formed so that at least a partial region overlaps the anodes 21, 22, and 23. The pixel defining layer 30 may be formed to have a height of substantially 2,000 to 5,000 Å.

Figure 7:
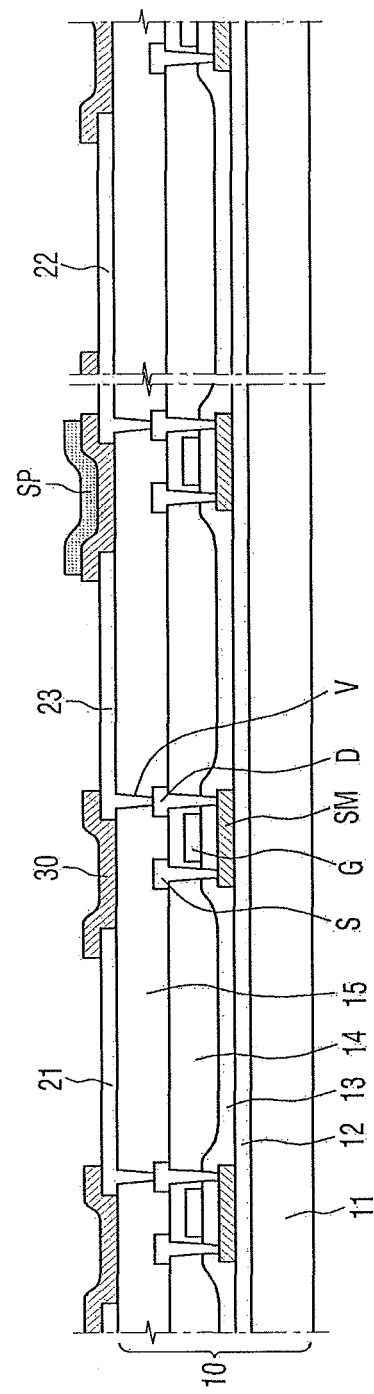

In the forming of the spacer SP (S40), the spacer SP may be formed on the pixel defining layer 30 as illustrated in FIG. 7. The spacer SP may be formed by deposition or coating using a separate mask. The spacer SP may be formed between two third pixels P3 which are adjacent to each other in a row direction. The spacer SP may be formed to overlap the third anode 23. The spacer SP may be formed so that a height h2 from the upper surface of the pixel defining layer 30 is substantially 2,000 to 5,000 Å. The spacer SP may be formed so that a distance between the first pixel P1 and the second pixel P2 is about 8 μm or more. The spacer SP may be formed so that a distance from the third pixel P3 is about 3 μm or less.

Figure 8:
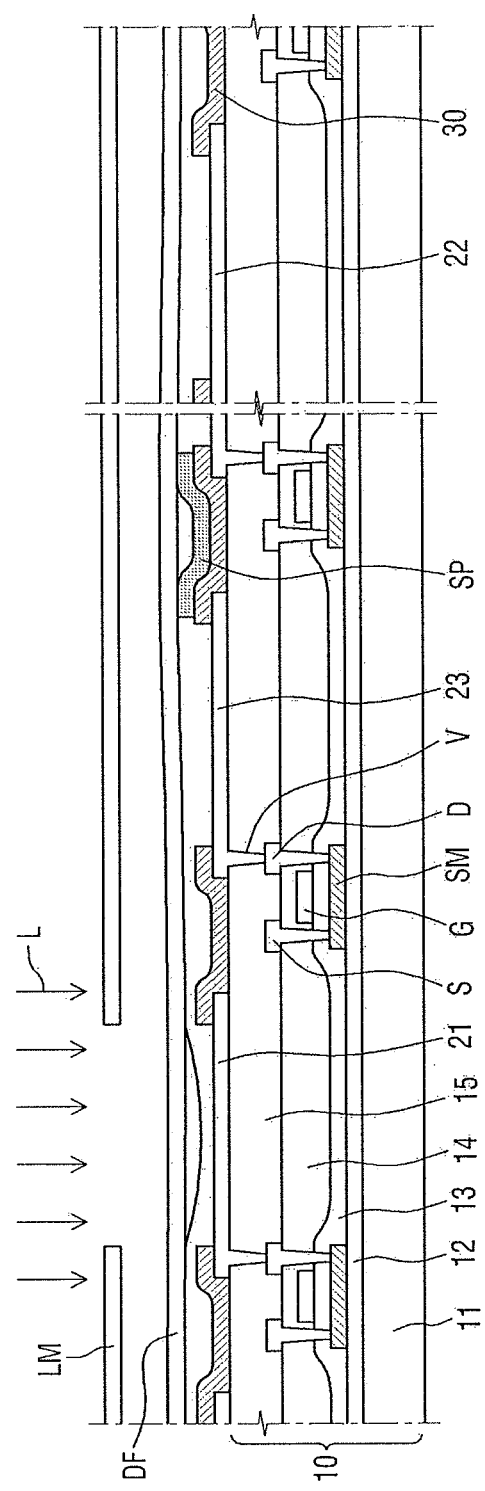

In the forming of the first and second organic emission layers 41 and 42 (S50), the first and second organic emission layers 41 and 42 may be formed by transfer using a laser. Referring to FIG. 8, when forming the first organic emission layer 41, a donor film DF may be disposed to contact the spacer SP formed at the relatively highest position among structures of the organic light emitting display device 1 formed in advance. Since the donor film DF may be bent by gravity, a distance from the donor film DF in the region in the third pixel P3, which is relatively adjacent to the spacer SP, is larger than a distance from the donor film DF in the regions in the first and second pixels P1 and P2, which are relatively spaced apart from the spacer SP.

A light mask LM may be disposed on the donor film DF. Openings may be formed in the light mask LM. The openings formed in the light mask LM may be disposed on the first pixel P1. A laser L may be irradiated to the donor film DF through the openings of the light mask LM. An organic material forms a droplet from the donor film DF, by the laser L irradiated to the donor film DF, to be discharged downward. The droplet of the organic material contacts the first organic layer 21. As a result, transfer of the first organic layer 21 may be performed.

Figure 9:
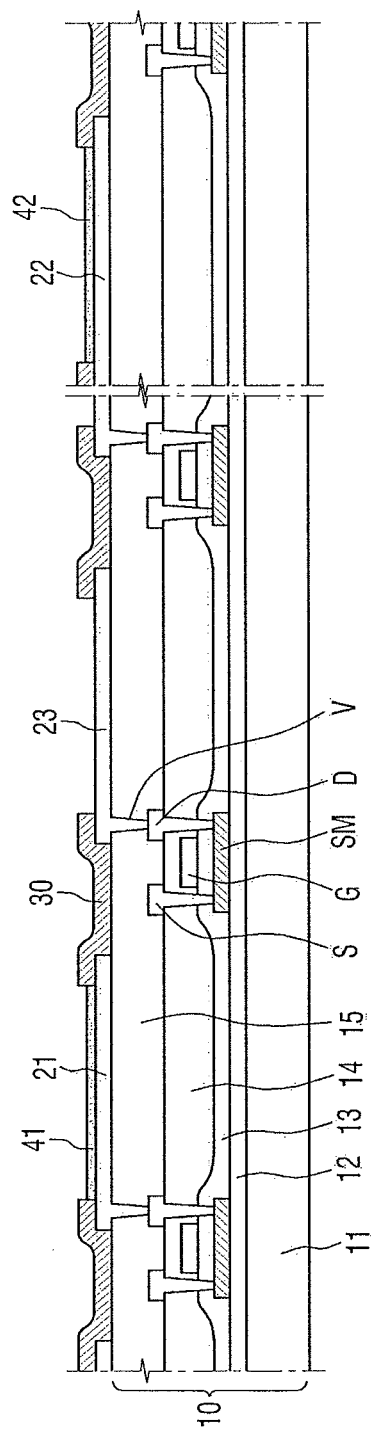

The second organic layer 22 may be formed by substantially the same method as the first organic layer 21. By such a method, the first and second organic layers 21 and 22 may be formed as illustrated in FIG. 9. Since the distance from the donor film DF of the region in the third pixel P3 by the spacer SP is larger than a distance from the donor film DF of the region in the first and second pixels P1 and P2, when the first organic layer 41 or the second organic layer 42 is transferred, the possibility that the first organic layer 41 and the second organic layer 42 penetrate into the third pixel P3 may be reduced. Accordingly, even though the distance between the pixels is reduced, the first organic layer 41 and the second organic layer 42 may be prevented from penetrating into the third pixel P3. As a result, it is possible to improve an aperture ratio and resolution of the organic light emitting display device 1.

Figure 10:
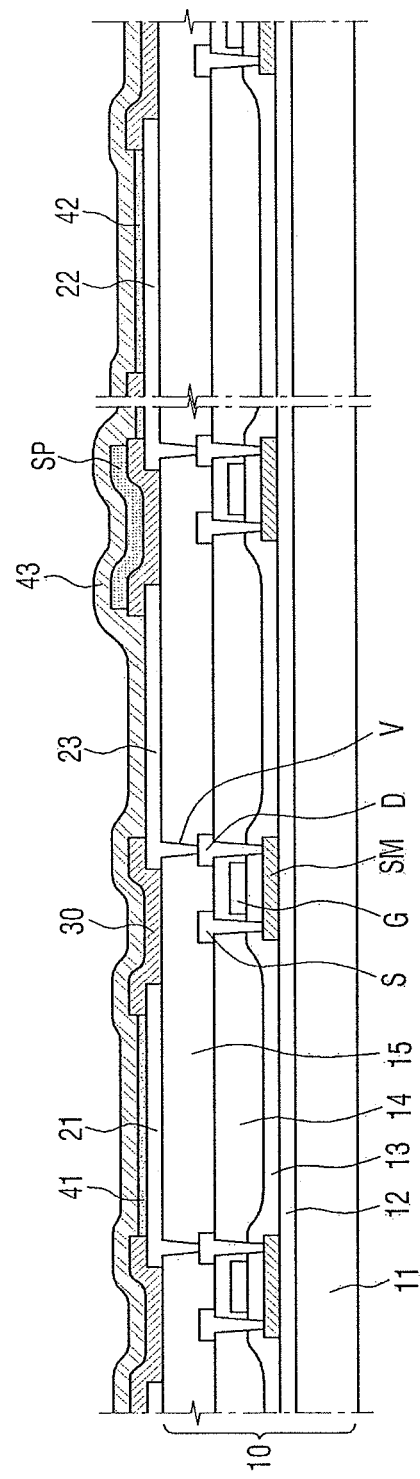

In forming the third organic emission layer 43 (S60), as illustrated in FIG. 10, the third organic emission layer 43 may be formed on the front side of the organic light emitting display device 1. The third organic emission layer 43 may be formed on the first and second organic emission layers 41 and 42. The third organic emission layer 43 may be formed without a separate mask.

In forming the cathode 50 (S70), the cathode 50 may be formed on the third organic emission layer 43. Through the forming of the cathode 50, the organic light emitting display device illustrated in FIG. 2 may be formed.

Figure 11:
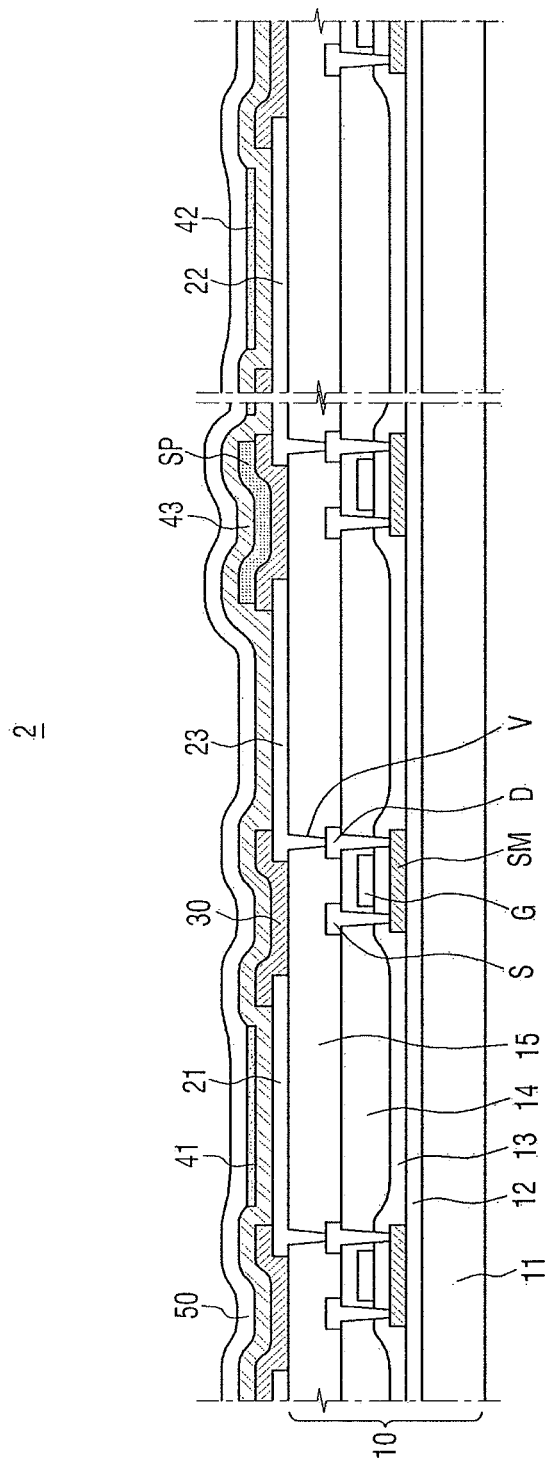
FIG. 11 illustrates a cross-sectional view of an organic light emitting display device according to another embodiment.
Figure 12:
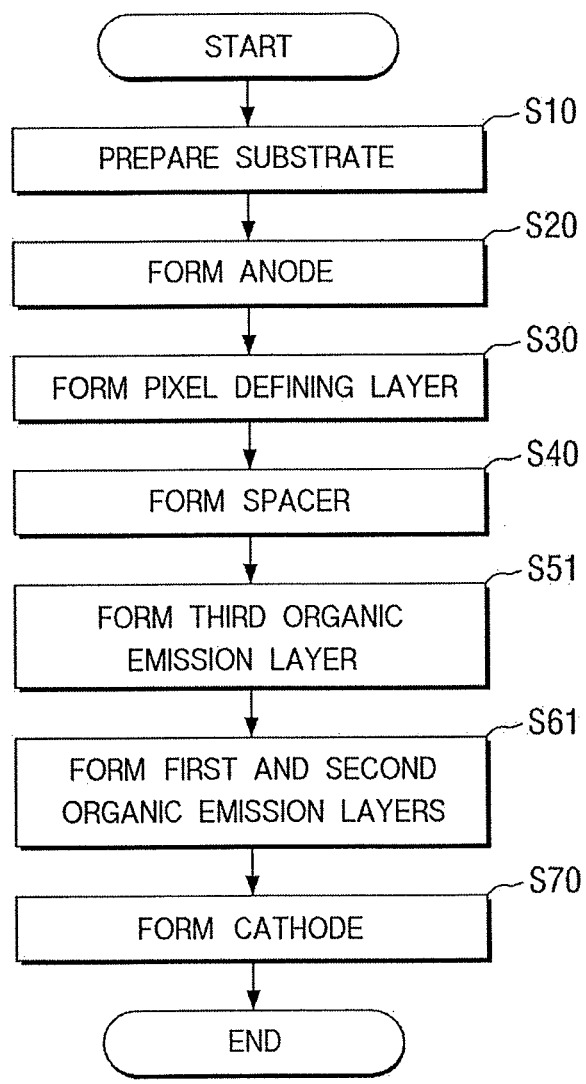
FIG. 12 illustrates another embodiment of a method of manufacturing an organic light emitting display device.

FIG. 11 illustrates a cross-sectional view of another embodiment of an organic light emitting display device 2. FIG. 12 illustrates an embodiment of a method of manufacturing the organic light emitting display device in FIG. 11.

Referring to FIG. 12, in an organic light emitting display device 2, a third organic layer 43 may be disposed below first and second organic layers 41 and 42. Even though the third organic layer 43 is disposed below first and second organic layers 41 and 42, operation of the organic light emitting display device 2 is substantially the same as that of the organic light emitting display device 1 in FIGS. 1 and 2. Also, a plan view of the organic light emitting display device 2 is substantially the same as FIG. 1.

The method of manufacturing organic light emitting display device 2 may include preparing the substrate 10 (S10), forming the anodes 21, 22, and 23 (S20), forming the pixel defining layer 30 (S30), forming the spacer SP (S40), forming the third organic emission layer 43 (S51), forming the first and second organic emission layers 41 and 42 (S61), and forming the cathode 50 (S70). In order to manufacture the organic light emitting display device 2, forming the third organic emission layer 43 (S51) may precede forming the first and second organic emission layers 41 and 42 (S61). Other descriptions for the manufacturing method of the organic light emitting display device 2 are substantially the same as the descriptions for the manufacturing method of the organic light emitting display device 1 described with reference to FIGS. 3 to 11 and thus omitted.

Figure 13:
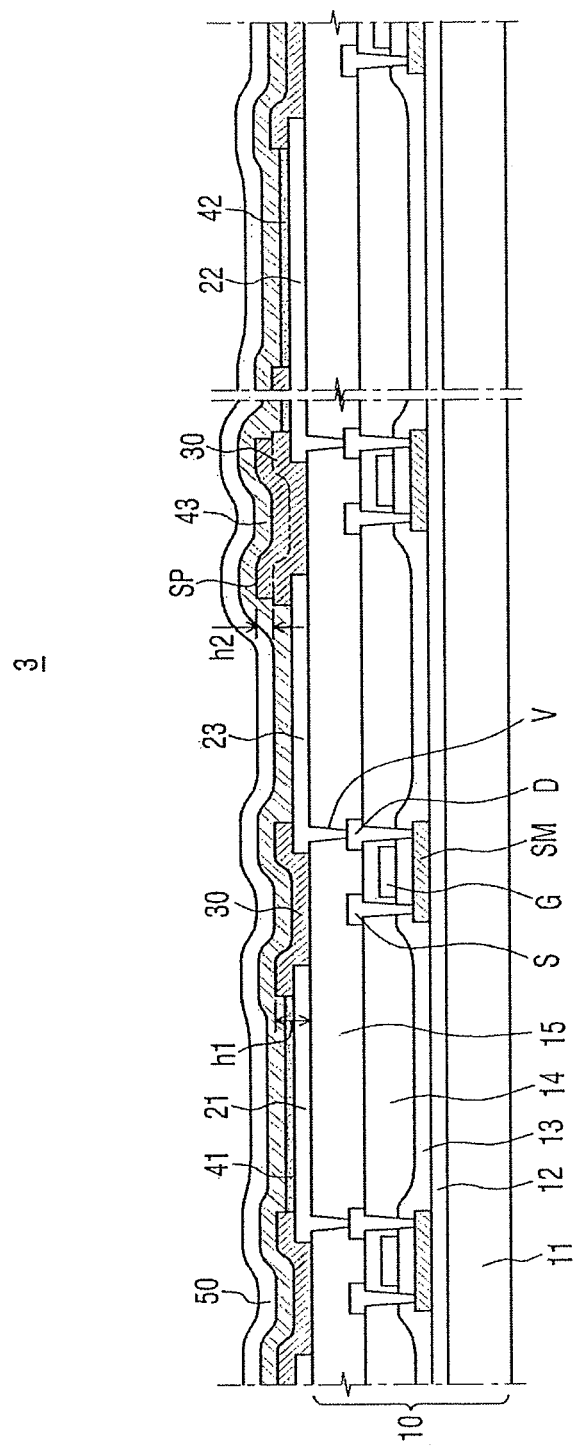
FIG. 13 illustrates a cross-sectional view of an organic light emitting display device according to another embodiment.
Figure 14:
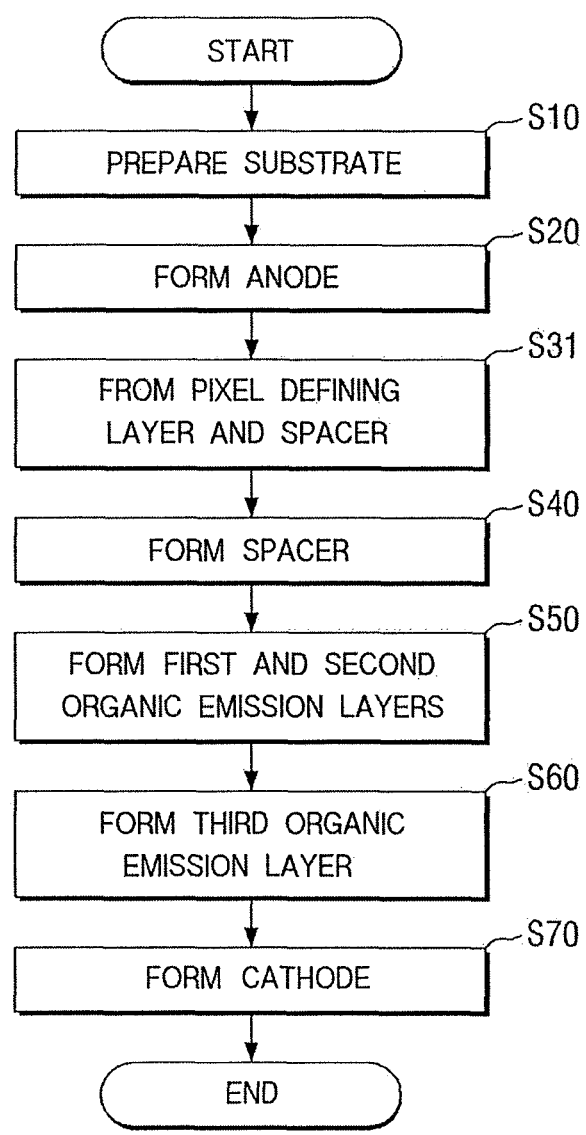
FIG. 14 illustrates another embodiment of a method of manufacturing an organic light emitting display device.

FIG. 13 illustrates a cross-sectional view of another embodiment of an organic light emitting display device 3. FIG. 14 illustrates a flowchart of a method of manufacturing the organic light emitting display device in FIG. 13.

Referring to FIG. 13, in organic light emitting display device 3, the spacer SP and the pixel defining layer 30 may be integrally formed. Thus, a boundary between the spacer SP and the pixel defining layer 30 may not exist. Also, a region of the pixel defining layer 30, which relatively protrudes from the upper surface as compared with the other regions, may be defined as the spacer SP. Other descriptions for the organic light emitting display device 3 are substantially the same as the descriptions for the organic light emitting display device 1 in FIGS. 1 and 2 and thus omitted.

Referring to FIG. 14, the method of manufacturing organic light emitting display device 3 may include preparing the substrate 10 (S10), forming the anodes 21, 22, and 23 (S20), forming the pixel defining layer 30 and the spacer SP (S31), forming the first and second organic emission layers 41 and 42 (S50), forming the third organic emission layer 43 (S60), and forming the cathode 50 (S70). In forming the pixel defining layer 30 and the spacer SP (S31), a material for forming the pixel defining layer 30 is coated on a structure of the organic light emitting display device 3 formed in advance. The coated material is then selectively removed so that a removed amount in the region where the spacer SP is formed is smaller than in other regions of the pixel defining layer 30. As a result, the pixel defining layer 30 and the spacer SP may be integrally formed. Other descriptions for the manufacturing method of the organic light emitting display device 3 are substantially the same as the descriptions for the manufacturing method of the organic light emitting display device 1 described with reference to FIGS. 3 to 11 and thus omitted.

According to some embodiments, in the organic light emitting display device, the spacer SP and the pixel defining layer 30 may be integrally formed. Simultaneously, the third organic emission layer 43 may be disposed below the first and second organic emission layers 41 and 42.

By way of summation and review, in order to improve an aperture ratio or resolution of an organic light emitting display device, distances between pixels may be reduced. When the distance between the pixels is reduced, an effective emission area is increased and, thus, the aperture ratio or the resolution may be increased. In accordance with one or more embodiments, the organic emission layer disposed in one pixel is prevented from penetrating into adjacent pixels, for example, having different colors.

If this penetration were not prevented, deformation of colors of the pixels may occur.

Also, there may be a decrease display quality of the organic light emitting display device. Particularly, when an organic emission layer for emitting green or red light penetrates into a blue pixel, a color of the blue pixel may be deformed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
    a substrate;
    a pixel defining layer on the substrate, the pixel defining layer including first, second, third, and fourth portions and surrounding a plurality of openings corresponding to a plurality of pixels including a plurality of first pixels, a plurality of second pixels, and a plurality of third pixels emitting light of different colors, the first portion of the pixel defining layer between the first and third pixels, the second portion of the pixel defining layer between the second and third pixels, the third portion of the pixel defining layer between the third pixels, the fourth portion of the pixel defining layer between the first and second pixels; and a spacer on the pixel defining layer, wherein
the first pixels and the second pixels are alternately disposed in a row direction, and the third pixels are continuously disposed in the row direction, wherein:
the row in which the first pixels and the second pixels are alternately disposed and the row in which the third pixels are continuously disposed are adjacent to each other in a column direction, and
the spacer is selectively disposed on the third portion of the pixel defining layer between the third pixels among the first, second, third, and fourth portions of the pixel defining layer, and wherein
a height of the spacer is substantially 3,000 to 7,000 Å.

2. The organic light emitting display device as claimed in claim 1, wherein the row in which the first pixels and the second pixels are alternately disposed and the row in which the third pixels are continuously disposed, are alternately disposed in the column direction.

3. The organic light emitting display device as claimed in claim 1, further comprising:
a plurality of anodes including first to third anodes on the substrate;
a plurality of organic emission layers on the plurality of anodes; and
a cathode on the organic emission layers, wherein:
the first anodes are in the first pixels, the second anodes are in the second pixels, the third anodes are in the third pixels, and a partial region of the plurality of anodes is below the pixel defining layer, and wherein the spacer overlaps the third anodes.

4. The organic light emitting display device as claimed in claim 3, wherein the organic emission layers include:
a plurality of first organic emission layers in the first pixels and emitting light of a first color;
a plurality of second organic emission layers in the second pixels and emitting light of a second color; and
a third organic emission layer in the first to third pixels and emitting light of a third color.

5. The organic light emitting display device as claimed in claim 4, wherein the third organic emission layer is on the first organic emission layers and the second organic emission layers.

6. The organic light emitting display device as claimed in claim 4, wherein the third organic emission layer is below the first organic emission layers and the second organic emission layers.

7. The organic light emitting display device as claimed in claim 1, wherein
a height of the pixel defining layer is substantially 2,000 to 5,000 Å.

8. The organic light emitting display device as claimed in claim 1, wherein a distance between the spacer and a pixel of the first pixels adjacent to the spacer and a distance between the spacer and a pixel of the second pixels adjacent to the spacer are about 8 μm or more.

9. The organic light emitting display device as claimed in claim 1, wherein a distance between the spacer and a pixel of the third pixels adjacent to the spacer is about 3 μm or less.

10. The organic light emitting display device as claimed in claim 1, wherein the pixel defining layer and the spacer are integrally formed.

11. A method of manufacturing an organic light emitting display device, comprising:
forming a plurality of anodes including a plurality of first anodes, a plurality of second anodes, and a plurality of third anodes on a substrate;
forming a pixel defining layer on the plurality of anodes and the substrate, the pixel defining layer including first, second, third, and fourth portions and surrounding a plurality of openings exposing respective areas of the plurality of anodes, the first portion of the pixel defining layer between the first and third anodes, the second portion of the pixel defining layer between the second and third anodes, the third portion of the pixel defining layer between the third anodes, the fourth portion of the pixel defining layer between the first and second pixels;
forming a spacer on the pixel defining layer;
forming a plurality of first organic emission layers on the first anodes and forming a plurality of second organic emission layers on the second anodes;
forming a third organic emission layer on the first organic emission layers and the second organic emission layers; and
forming a cathode on the third organic emission layer, wherein
the first anodes and the second anodes are alternately disposed in a row direction and the third anodes are continuously disposed in the row direction, wherein:
the row in which the first anodes and the second anodes are alternately disposed and the row in which the third anodes are continuously disposed are adjacent to each other in a column direction, and
the spacer is selectively disposed on the third portion of the pixel defining layer between the openings exposing two adjacent third anodes in the row direction among the first, second, third, and fourth portions of the pixel defining layer, and wherein
a height of the spacer is substantially 3,000 to 7,000 Å.

12. The method as claimed in claim 11, wherein the first organic emission layers and the second organic emission layers are formed by laser transfer.

13. The method as claimed in claim 11, wherein the spacer is formed to overlap the third anodes.

14. The method as claimed in claim 11, wherein a height of the pixel defining layer is substantially 2,000 to 5,000 Å.

15. The method as claimed in claim 14, wherein a distance between the spacer and an anode of the first anodes adjacent to the spacer and a distance between the spacer and an anode of the second anodes adjacent to the spacer are about 8 μm or more.

16. The method as claimed in claim 14, wherein a distance between the spacer and one of the plurality of openings corresponding to the third anodes adjacent to the spacer is about 3 μm or less.

17. The method as claimed in claim 11, wherein the spacer is formed on the pixel defining layer by deposition.

18. The method as claimed in claim 17, wherein the spacer is formed by selectively removing the pixel defining layer.

19. A method of manufacturing an organic light emitting display device, comprising:
preparing a substrate including a base, a plurality of thin film transistors disposed on the base, and an insulating layer on the thin film transistors and having a plurality of via holes exposing respective areas of the plurality of thin film transistors;
forming a plurality of anodes on the substrate, the plurality of anodes connected to the plurality of thin film transistors through the plurality of via holes, the plurality of anodes including a plurality of first anodes, a plurality of second anodes, and a plurality of third anodes;

forming a pixel defining layer on the plurality of anodes, the pixel defining layer including a plurality of openings exposing respective areas of the plurality of anodes;

forming a spacer on the pixel defining layer;

forming a third organic emission layer on the first to third anodes;

forming a plurality of first organic emission layers on the first anodes and the third organic emission layer and forming a plurality of second organic emission layers on the second anodes and the third organic emission layer; and forming a cathode on the first to third organic emission layers, wherein the first anodes and the second anodes are alternately disposed in a row direction and the third anodes are continuously disposed in the row direction, wherein:

the row in which the first anodes and the second anodes are alternately disposed and the row in which the third anodes are continuously disposed are adjacent to each other in a column direction, and the spacer is disposed on a portion of the pixel defining layer between the openings exposing two adjacent third anodes in the row direction, wherein:

a height of the pixel defining layer is substantially 2,000 to 5,000 Å, and a height of the spacer is substantially 3,000 to 7,000 Å.

20. The organic light emitting display devices as claimed in claim 1, wherein the first pixels and the third pixels do not overlap each other.

21. An organic light emitting display device, comprising:

a substrate;

a pixel defining layer on the substrate, the pixel defining layer including first, second and third portions and surrounding a plurality of openings corresponding to a plurality of pixels including a plurality first pixels, a plurality of second pixels, and a plurality of third pixels emitting light of different colors, the first portion of the pixel defining layer between the first and third pixels, the second portion of the pixel defining layer between the second and third pixels, the third portion of the pixel defining layer between the third pixels; and a spacer on the pixel defining layer, wherein the first pixels and the second pixels are alternately disposed in a row direction, and the third pixels are continuously disposed in the row direction, wherein:

the row in which the first pixels and the second pixels are alternately disposed and the row in which the third pixels are continuously disposed are adjacent to each other in a column direction, and the spacer is selectively disposed on the third portion of the pixel defining layer between the third pixels among the first, second and third portions of the pixel defining layer, and wherein a height of the spacer is substantially 3,000 to 7,000 Å.

* * * * *